United States Patent
Mathieu

(10) Patent No.: US 11,329,372 B2
(45) Date of Patent: May 10, 2022

(54) LIGHTWEIGHT RADOME FOR HOUSING AN ANTENNA

(71) Applicant: NetComm Wireless Pty Ltd, Lane Cove (AU)

(72) Inventor: Paul Mathieu, Lane Cove (AU)

(73) Assignee: NetComm Wireless Pty Ltd, Lane Cove (AU)

( * ) Notice: Subject to any disclaimer, the term of this patent is extended or adjusted under 35 U.S.C. 154(b) by 0 days.

(21) Appl. No.: 17/077,675

(22) Filed: Oct. 22, 2020

(65) Prior Publication Data
US 2021/0044008 A1 Feb. 11, 2021

Related U.S. Application Data

(63) Continuation of application No. PCT/AU2019/050349, filed on Apr. 18, 2019.

(30) Foreign Application Priority Data

Apr. 23, 2018 (AU) .................. 2018901335

(51) Int. Cl.
*H01Q 1/42* (2006.01)
*H01Q 1/12* (2006.01)

(52) U.S. Cl.
CPC ............... *H01Q 1/42* (2013.01); *H01Q 1/12* (2013.01)

(58) Field of Classification Search
CPC ......... H01Q 1/12; H01Q 1/1207; H01Q 1/02; H01Q 1/40; H01Q 1/405; H01Q 1/42; H01Q 1/422
See application file for complete search history.

(56) References Cited

U.S. PATENT DOCUMENTS

| 5,900,840 A | * | 5/1999 | Yajima | H01Q 21/061 343/713 |
| 7,138,958 B2 | | 11/2006 | Syed et al. | |
| 7,429,958 B2 | | 9/2008 | Lindackers et al. | |
| 8,222,526 B2 | | 7/2012 | Bresney et al. | |
| 8,855,730 B2 | * | 10/2014 | Sanford | H01Q 1/428 455/575.7 |

(Continued)

FOREIGN PATENT DOCUMENTS

| DE | 4106077 A1 | 9/1992 |
| EP | 1717900 B1 | 3/2009 |

(Continued)

OTHER PUBLICATIONS

International Search Report and Written Opinion of the International Searching Authority dated May 29, 2019 in International Patent Application No. PCT/AU2019/050349. 8 pages.

(Continued)

*Primary Examiner* — Jason Crawford
(74) *Attorney, Agent, or Firm* — Kilpatrick Townsend & Stockton LLP

(57) ABSTRACT

A radome (10) for housing an antenna (50), the radome (10) comprising a front portion (30); and a rear portion (20) configured to mate with the front portion (30); wherein the front portion (30) includes a peripheral channel region (31) configured to contain an adhesive sealant (60) and receive a peripheral edge (21) of the rear portion (20) that is partially submerged in the adhesive sealant (60) before it cures.

9 Claims, 10 Drawing Sheets

(56) References Cited

U.S. PATENT DOCUMENTS

| | | | |
|---|---|---|---|
| 9,799,951 B2* | 10/2017 | Sawaya | H01Q 1/42 |
| 10,374,302 B2* | 8/2019 | Kobayashi | H01Q 1/42 |
| 2003/0094770 A1* | 5/2003 | Gomez | F16J 15/025 |
| | | | 277/626 |
| 2006/0244667 A1* | 11/2006 | Thompson | H01Q 1/3275 |
| | | | 343/713 |
| 2007/0103374 A1* | 5/2007 | Lindackers | H01Q 1/3275 |
| | | | 343/713 |
| 2008/0111752 A1* | 5/2008 | Lindackers | H01Q 21/28 |
| | | | 343/713 |
| 2008/0122708 A1* | 5/2008 | Lindackers | H01Q 1/1214 |
| | | | 343/713 |
| 2011/0221626 A1* | 9/2011 | Hill | B64C 7/00 |
| | | | 342/30 |
| 2014/0292593 A1* | 10/2014 | Thiam | H01Q 9/0421 |
| | | | 343/713 |
| 2016/0036121 A1* | 2/2016 | Hayashi | H01Q 1/42 |
| | | | 343/713 |
| 2016/0064807 A1* | 3/2016 | Reed | H01Q 1/38 |
| | | | 343/713 |
| 2016/0104932 A1* | 4/2016 | Aminzadeh | H01Q 1/42 |
| | | | 343/872 |
| 2017/0149124 A1* | 5/2017 | Fabre | H01Q 1/3275 |
| 2017/0317407 A1* | 11/2017 | Yasin | H01Q 1/42 |
| 2018/0083348 A1* | 3/2018 | Thiam | H01Q 9/0407 |
| 2018/0159208 A1* | 6/2018 | Ameri | H01Q 9/0414 |
| 2018/0351243 A1* | 12/2018 | Lewis | H01Q 1/282 |
| 2021/0044008 A1* | 2/2021 | Mathieu | H01Q 1/12 |

FOREIGN PATENT DOCUMENTS

| | | |
|---|---|---|
| JP | H07167326 A | 7/1995 |
| JP | H07109962 B2 | 11/1995 |

OTHER PUBLICATIONS

International Preliminary Report on Patentability dated Apr. 23, 2020 in International Patent Application No. PCT/AU2019/050349. 14 pages.

Extended European Search Report dated Apr. 16, 2021 in EP Patent Application No. 19793675.0. 10 pages.

* cited by examiner

LIGHTWEIGHT RADOME FOR HOUSING AN ANTENNA

CROSS-REFERENCES TO RELATED APPLICATIONS

This application is a continuation application of International Patent Application No. PCT/AU2019/050349 entitled "LIGHTWEIGHT RADOME FOR HOUSING AN ANTENNA," filed on Apr. 18, 2019, which claims priority to Australian Patent Application No. 2018901335, filed on Apr. 23, 2018, all of which are herein incorporated by reference in their entirety for all purposes.

FIELD OF THE INVENTION

The present invention relates to a lightweight radome for housing an antenna.

BACKGROUND OF THE INVENTION

Antennas include delicate components that may be damaged when exposed to ambient conditions. Therefore, antennas are often housed in radomes that prevent physical matter, such as debris, precipitation, moving air and the like, from coming into direct physical contact with antenna components. As such, a radome functions as a physical barrier to potentially damaging matter, while still permitting the propagation of electromagnetic radiation, particularly radio waves, to and from the protected antenna.

An antenna is typically housed in a radome that is transparent to radio waves over a frequency band dictated by the operational requirements of the antenna.

Existing radomes are susceptible to aging damage due to environmental conditions, as well as stress when exposed to high loads.

A heavier construction of a radome increases radio frequency (RF) transmission losses, decreases receiving sensitivity, and thus requires an increase in the transmission power or the size of the antenna, at a great cost.

BRIEF SUMMARY OF THE INVENTION

The inventive concept arises from a recognition that a radome which is lighter than prior radomes and continues to provide a structurally robust housing and a waterproof seal for an antenna housed within it, is highly desirable.

It is also advantageous to provide a radome that is simple, convenient and fast for an installer to mount at an installation site.

The present invention, in one aspect, is a radome for housing an antenna. The radome comprises a front portion. The radome also comprises a rear portion configured to mate with the front portion. The front portion includes a peripheral channel region configured to contain an adhesive sealant. The peripheral channel region is also configured to receive a peripheral edge of the rear portion that is partially submerged in the adhesive sealant before it cures.

The peripheral edge of the rear portion may be castellated or scalloped to increase a bonding surface area of the peripheral edge.

The front portion may include a plurality of alignment pins configured to align the front portion to the rear portion.

The front portion may include at least one first clip engagement member and the rear portion includes at least one corresponding second clip engagement member configured to mechanically engage with the first clip engagement member and mechanically secure the front portion with the rear portion.

The first clip engagement member may have a lower height than the alignment pins such that alignment of the front portion to the rear portion occurs before mechanical engagement of the clip engagement members.

The peripheral channel region may be substantially U-shaped.

The peripheral channel region may have a blind end comprising a stepped portion.

The peripheral edge of the rear portion may extend from an inner surface of the rear portion and is set back from an outer surface of the rear portion.

A base of the peripheral edge of the rear portion may be configured to abut against the stepped portion causing excess adhesive sealant to be displaced towards an inner wall surface of the peripheral channel region.

The present invention, in another aspect is a method for manufacturing a radome. The method comprises applying an adhesive sealant within a peripheral channel region of a front portion of the radome. The method also comprises positioning an antenna panel on an inner surface of the front portion of the radome. The method also comprises bonding a rear portion of the radome with the front portion of the radome. The step of bonding includes mechanically engaging the rear portion to the front portion and submerging a peripheral edge of the rear portion in the adhesive sealant to form a waterproof seal after the adhesive sealant has cured.

The method may further comprise aligning a rear portion of the radome with the front portion of the radome.

The method may further comprise fastening the antenna panel through holes in the rear portion to cause the clamping of the antenna panel between the front and rear portions.

Other advantages and features according to the invention will be apparent to those of ordinary skill upon reading this application.

BRIEF DESCRIPTION OF THE DRAWINGS

Embodiments of the invention will be described with respect to the figures, in which like reference numbers denote like elements and in which.

DETAILED DESCRIPTION OF THE INVENTION

Figure 1:
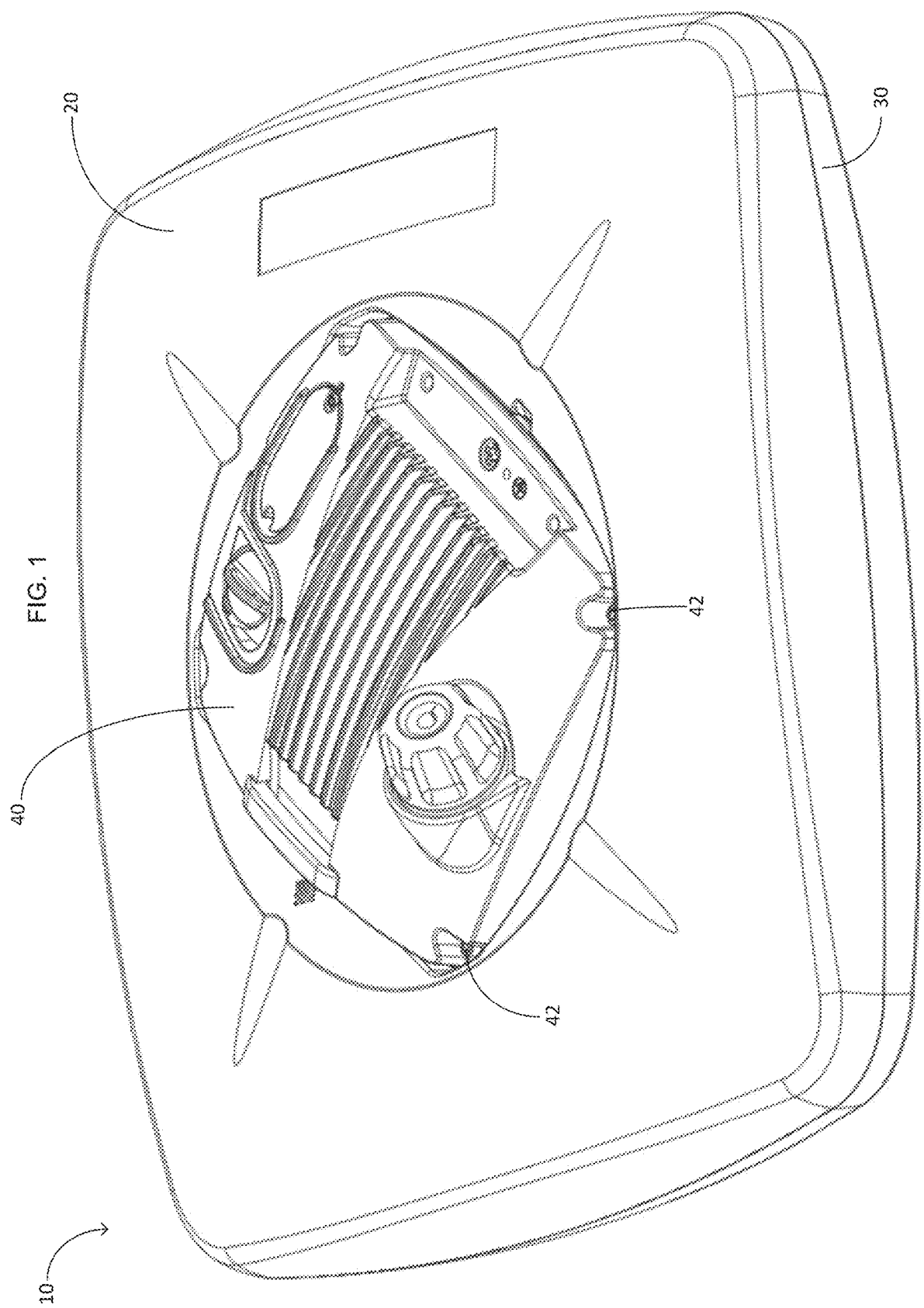
FIG. 1 is a perspective view of the rear side of a radome in accordance with a preferred embodiment of the present invention.
Figure 2:
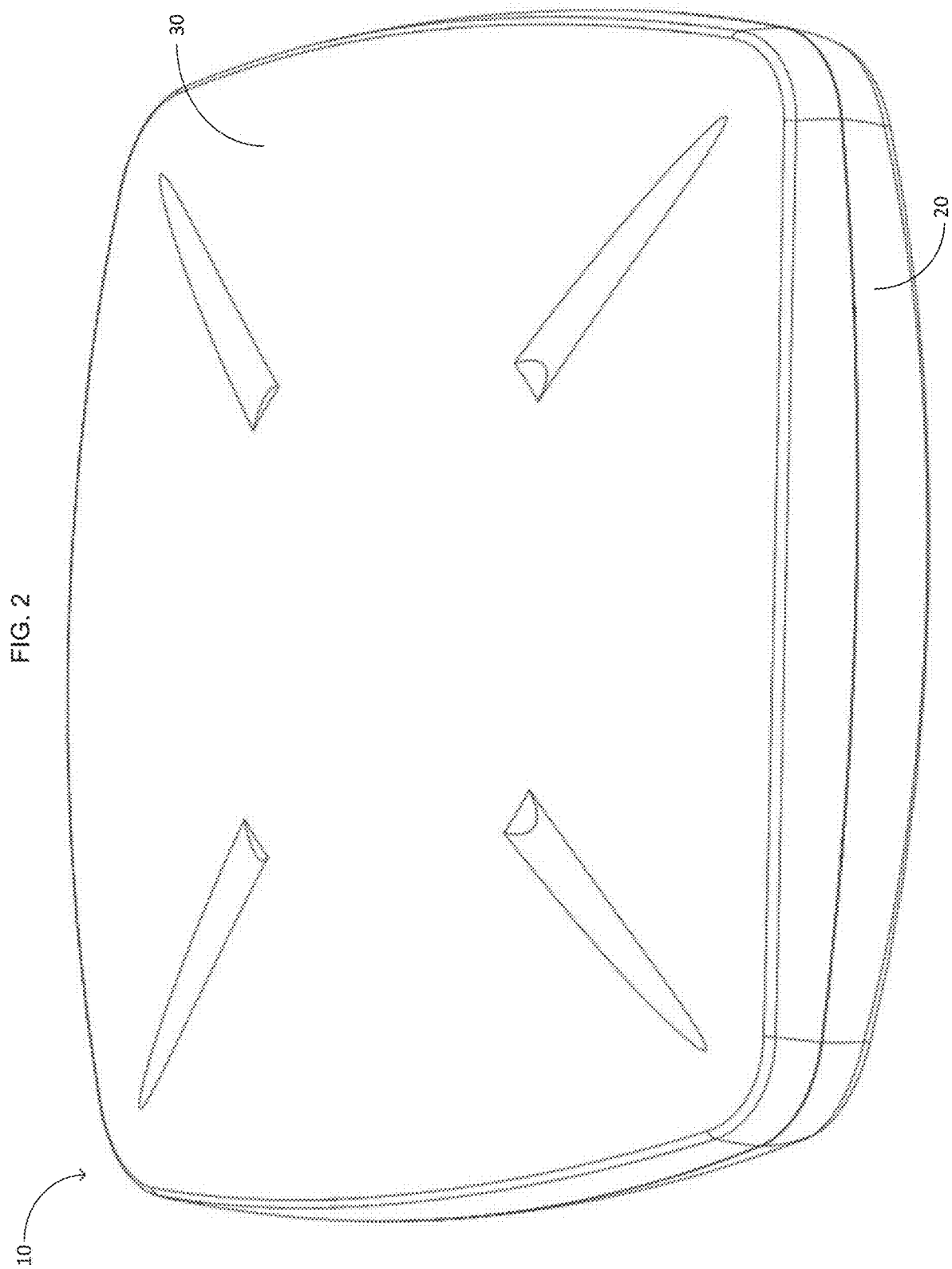
FIG. 2 is a perspective view of the front side of the radome of FIG. 1.

A preferred radome according to the present invention is illustrated in FIG. 1 and shown generally at reference numeral 10.

Figure 3:
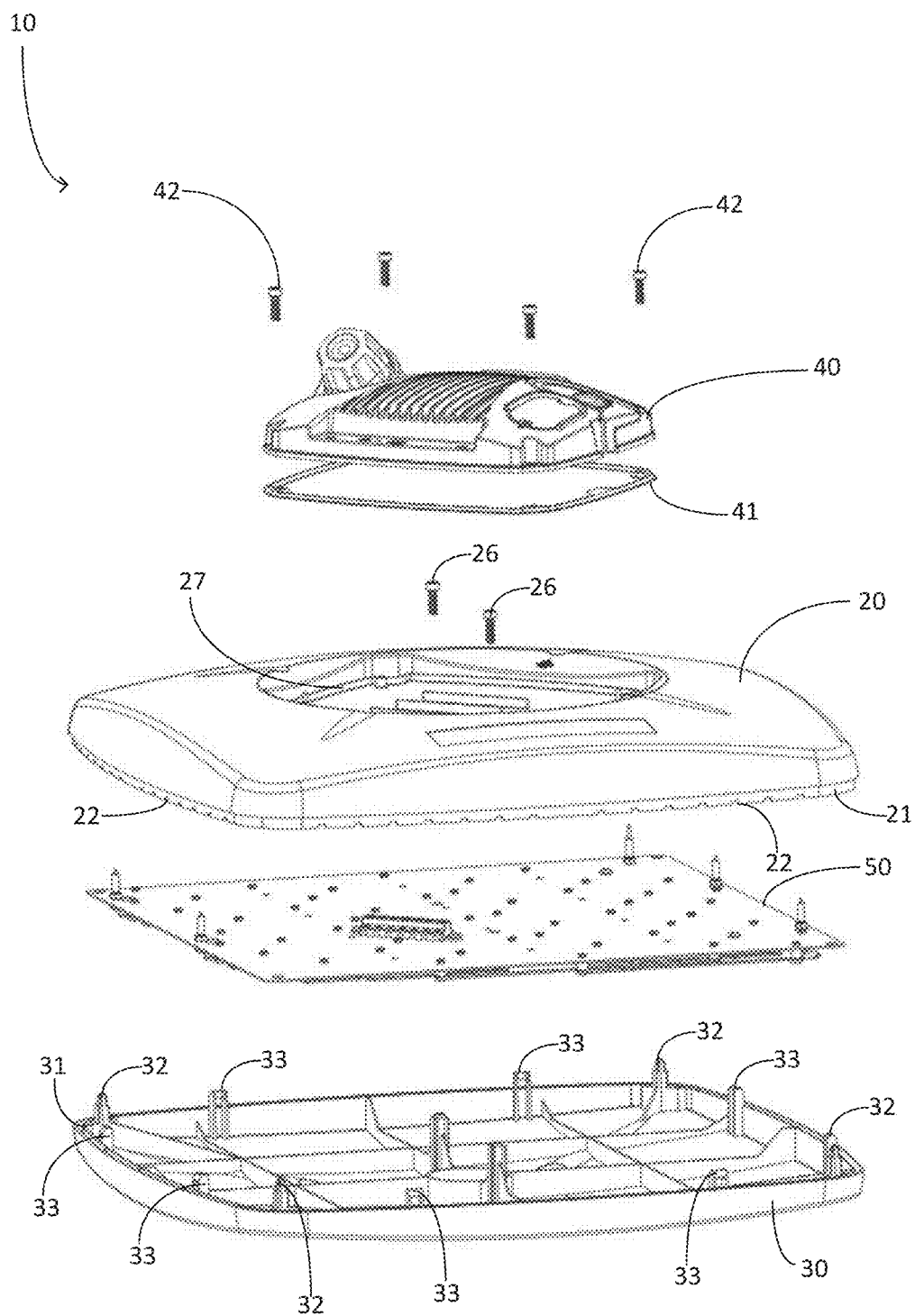
FIG. 3 is an exploded view of the radome containing an antenna of FIG. 1.

Referring to FIG. 3, the radome 10 for houses an antenna panel 50. The radome 10 comprises a front portion 30. The radome 10 also comprises a rear portion 20 configured to mate with the front portion 30. The front and rear portions 20, 30 may considered respective halves of the radome 10. The front portion 30 includes a peripheral channel region 31 configured to contain an adhesive sealant 60 (see FIGS. 6 and 8) and receive a peripheral edge 21 of the rear portion 20 that is partially submerged or immersed in the adhesive sealant 60 before it cures. After mating the rear portion 30 to the front portion 20, two screws 26 are screwed through respective screw holes in the rear portion 20 to firmly clamp the antenna panel 50 between the radome halves 20, 30. The screws 60 are not visible after a rear casting 40 is fitted into a receptacle region 27 provided on the outer surface of the rear portion 20. In another embodiment, the screws 26 may be not necessary in order to firmly clamp the antenna panel 50 between the radome halves 20, 30.

The radome 10 has a monocoque construction to reduce weight and still maintain structural integrity. The front and rear portions 20, 30 support their load by distributing tension and compression across the surface of the front and rear portions 20, 30. In one embodiment, the bonded radome 10 has a 10% thinner wall section than prior radomes, specifically 2.7 mm wall thickness instead of 3.0 mm. The size dimension of the front and rear portions 20 varies depending on the shape and design of the antenna panel 50.

Preferably, the adhesive sealant 60 is a Room-Temperature-Vulcanizing (RTV) silicone material. The adhesive sealant 60 is a plastic adhesive with good flame resistance that can cure at room temperature. The adhesive sealant 60 is applied as a sealing bead within the peripheral channel region 31 using an automatic applicator machine. A sufficient quantity of adhesive sealant 60 is applied by the automatic applicator machine such that the insertion of the peripheral edge 21 into the adhesive sealant 60 contained in the peripheral channel region 31 creates a waterproof seal and impermeable barrier. For example, the adhesive sealant 60 contained in the peripheral channel region 31 results in three surfaces of the peripheral edge 21 to be surrounded by and in contact with the adhesive sealant 60.

The peripheral edge 21 of the rear portion 20 is castellated or scalloped to increase bonding surface area of the peripheral edge 21 with the sealant 60. In one example, a series of small cut-outs 22 are defined along the peripheral edge 21.

Figure 5:
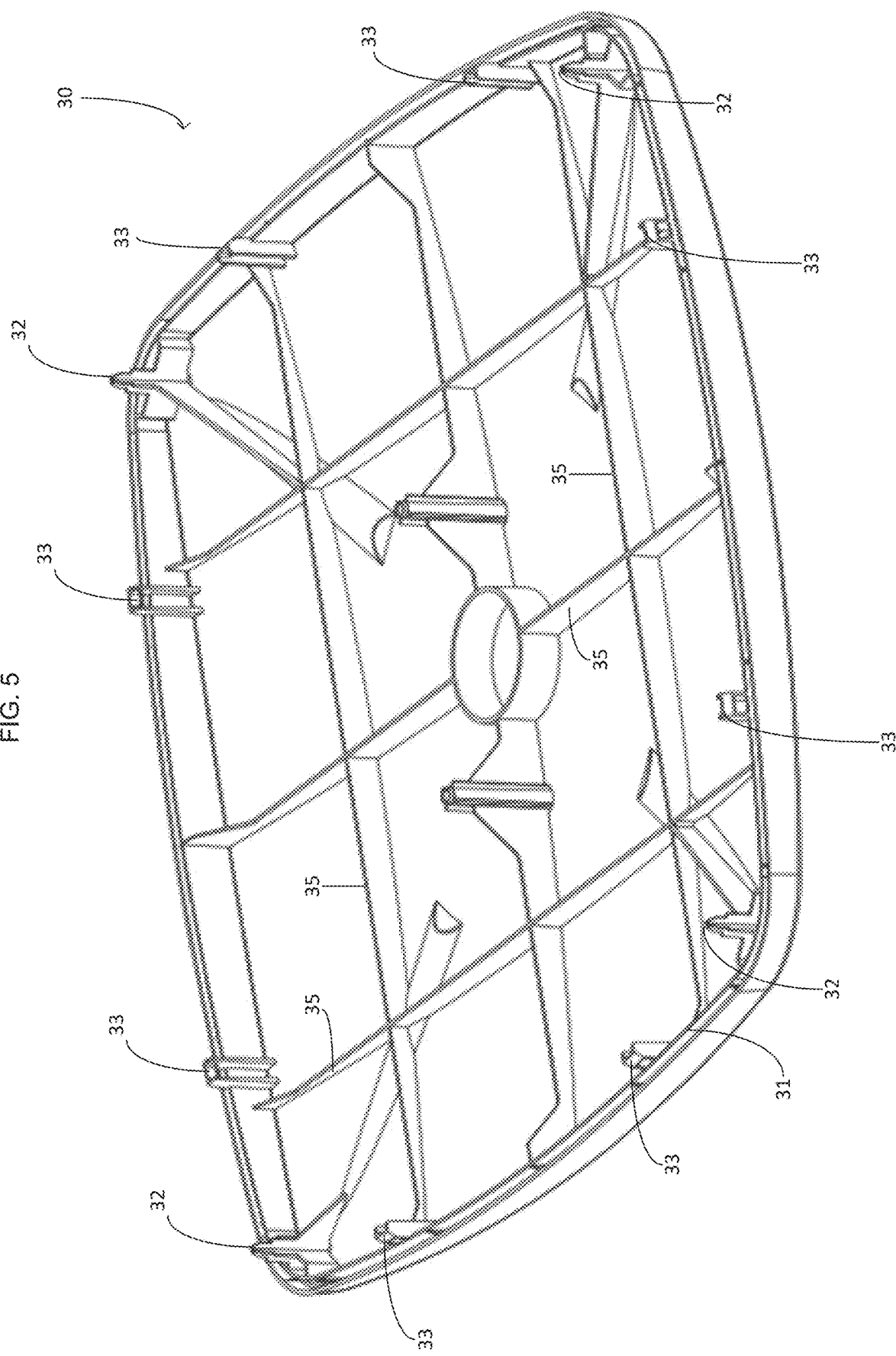
FIG. 5 is a front housing half of the radome of FIG. 1.

Referring to FIG. 5, the front portion 30 includes a plurality of alignment pins 32 configured to align the front portion 30 to the rear portion 20. This prevents accidental contact of the peripheral edge 21 with the sealant 60 unless there is alignment between the front and rear portions 20, 30. The alignment pins 32 also provide ease of assembly of the front and rear portions 20, 30.

Figure 4:
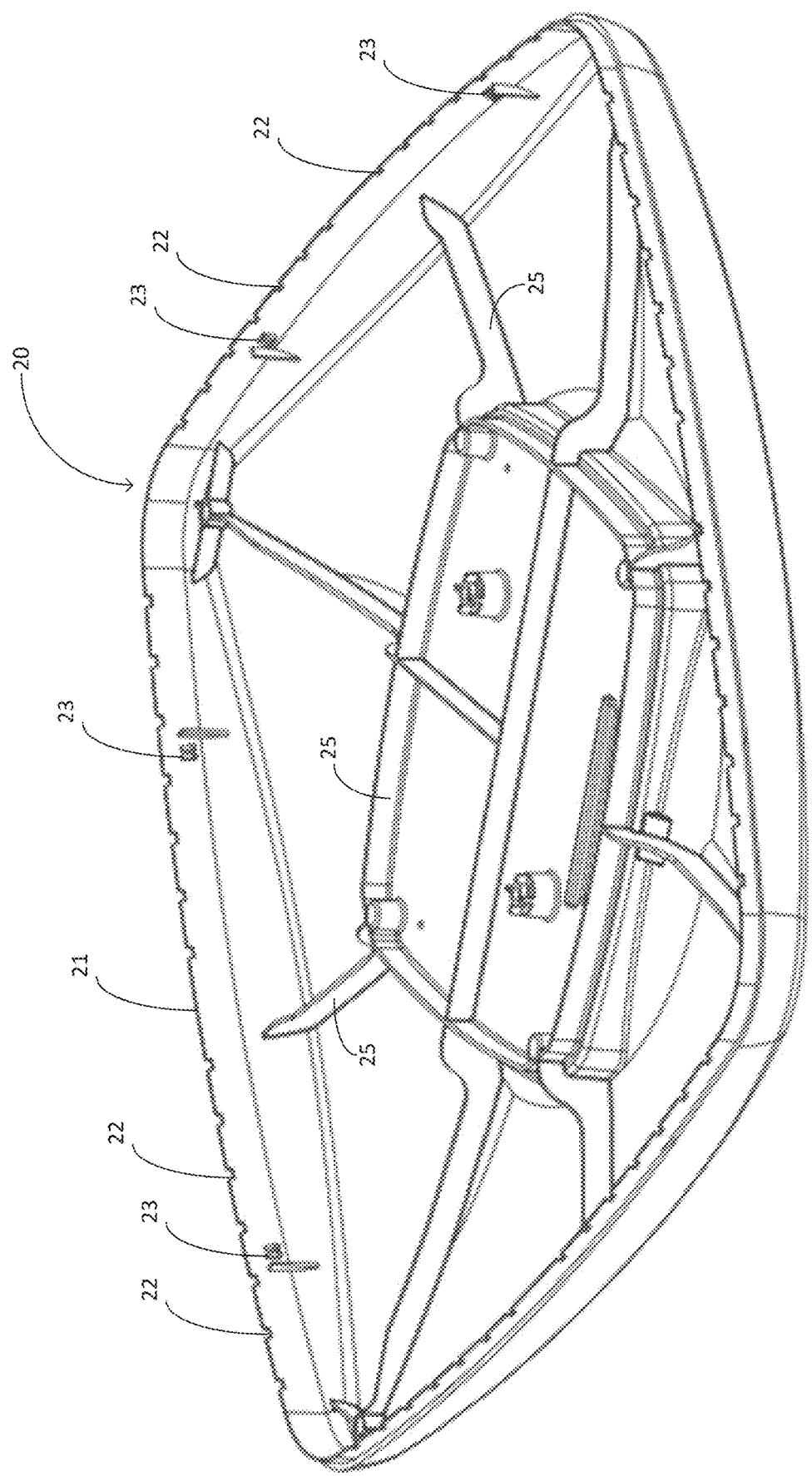
FIG. 4 is a rear housing half of the radome of FIG. 1.

The front portion 30 also includes a plurality of first clip engagement members 33. Turning to FIG. 4, the rear portion 20 includes a plurality of second clip engagement members 23 configured to mechanically engage with the first clip engagement members 33 and mechanically secure the front portion 30 with the rear portion 20. There may be six first clip engagement members 33 where there are two first clip engagement members 33 for each side of the front portion 30. There may be six second clip engagement members 23 where there are two second clip engagement members 23 for each side of the rear portion 20. The use of the clip engagement members 23, 33 provides mechanical retention in addition to the bonding and sealing provided by the sealant 60 surrounding the peripheral edge 21 in the peripheral channel region 31. The clips 23, 33 are internal clips that are preferably located on internal surfaces of the front and rear portions 20, 30 to not be externally visible. This provides a visually aesthetic finish producing a smooth outer side surface for the radome 10 and reduces the opportunity for unauthorised opening of the radome 10 or tampering. Also locating the clips 23, 33 protects them from accidental or intentionally external damage compared to externally disposing them, which could eventually lead to the front and rear portions 20, 30 separating under certain conditions.

The first clip engagement members 33 have a lower height than the alignment pins 32 such that alignment of the front portion 30 to the rear portion 20 occurs before mechanical engagement of the clip engagement members 23, 33 is possible.

Figure 6:
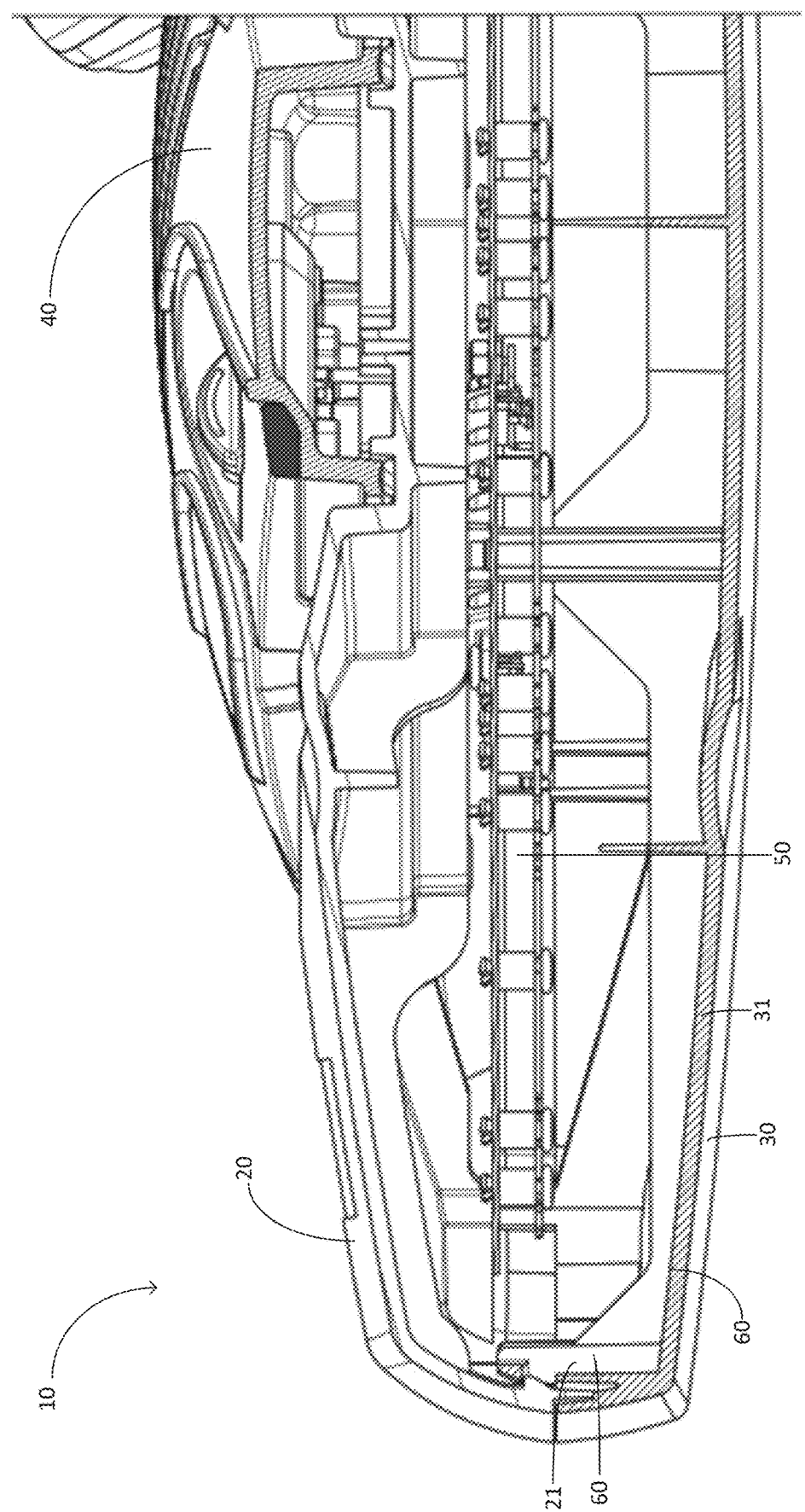
FIG. 6 is a sectional side view of part of the radome of FIG. 1.
Figure 7:
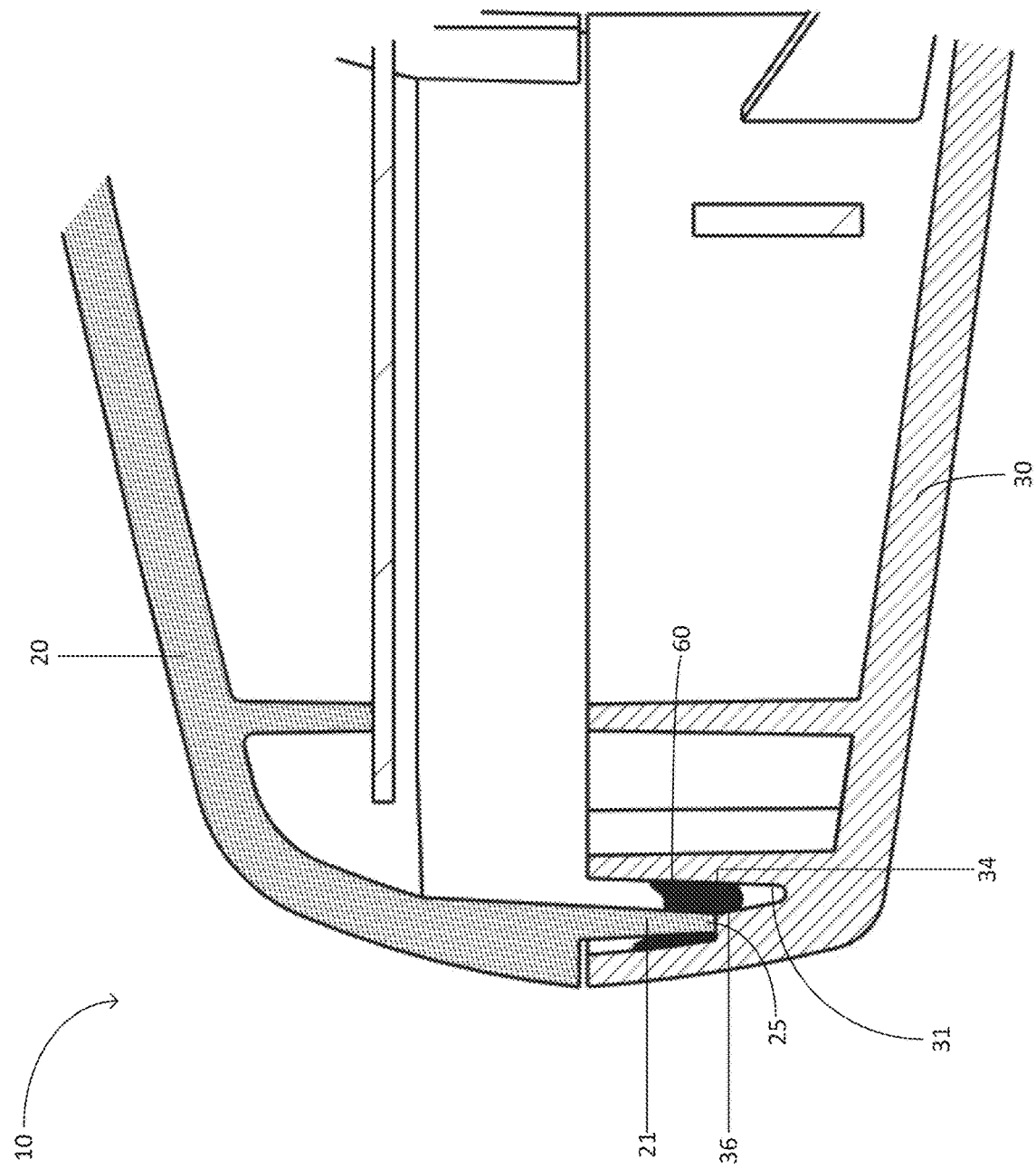
FIG. 7 is a zoomed in sectional side view of part of the radome of FIG. 1 depicting the location of an adhesive sealant.

Referring to FIGS. 6 and 7, in one embodiment, the peripheral channel region 31 has a blind end comprising a stepped portion 36 (see FIG. 7). The peripheral edge 21 extends from an inner surface of the rear portion 20 and is set back from the outer surface of the rear portion 20. A base 25 of the peripheral edge 21 of the rear portion 20 is configured to abut against the stepped portion 36. When the peripheral edge 21 is inserted into the peripheral channel region 31, the adhesive sealant 60 is displaced to surround three surfaces of the peripheral edge 21 which forms a waterproof seal. The angle of the peripheral edge 21 is biased or inclined to the outer side of the peripheral channel region 31 so that any excess sealant 60 is pushed inwards resulting in a clean finish on the exterior surface of the radome where the two halves 20, 30 meet rather than potentially leaving random blobs of unsightly sealant 60 visible. Also, the abutment of the base 25 of the peripheral edge 21 with the stepped portion 36 in the peripheral channel region 31 causes excess adhesive sealant 60 to be displaced our pushed inwardly towards an inner wall surface 34 of the peripheral channel region 31.

Figure 8:
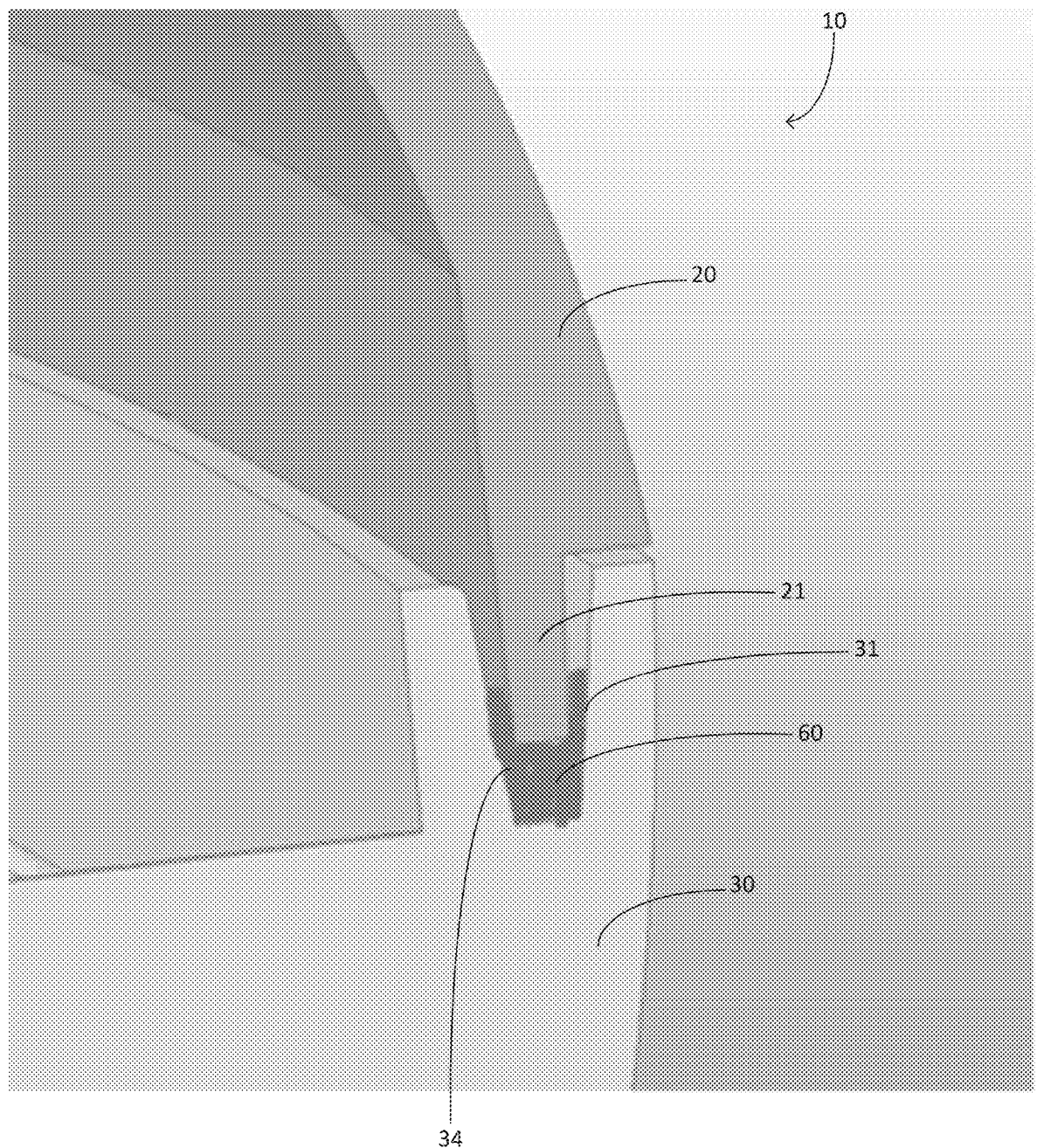
FIG. 8 is another zoomed in sectional side view of part of the radome of FIG. 1 depicting the location of an adhesive sealant.

Referring to FIG. 8, in one embodiment, the peripheral channel region 31 is substantially a U-shaped recess. The U-shaped recess is located at the periphery of the front portion 30. The recess 31 may be symmetrically shaped having a flat section at its blind end. The sides of the recess 31 may be slanted from a larger open end to a narrower blind end.

The radome 10 is formed by sealing together and permanently bonding two halves 20, 30 using a combination of adhesive sealant 60 and mechanical clips 23, 33. The sealed and bonded radome 10 prevents the ingress of moisture and the detachment of the front and rear portions 20, 30 after prolonged use.

Figure 9:
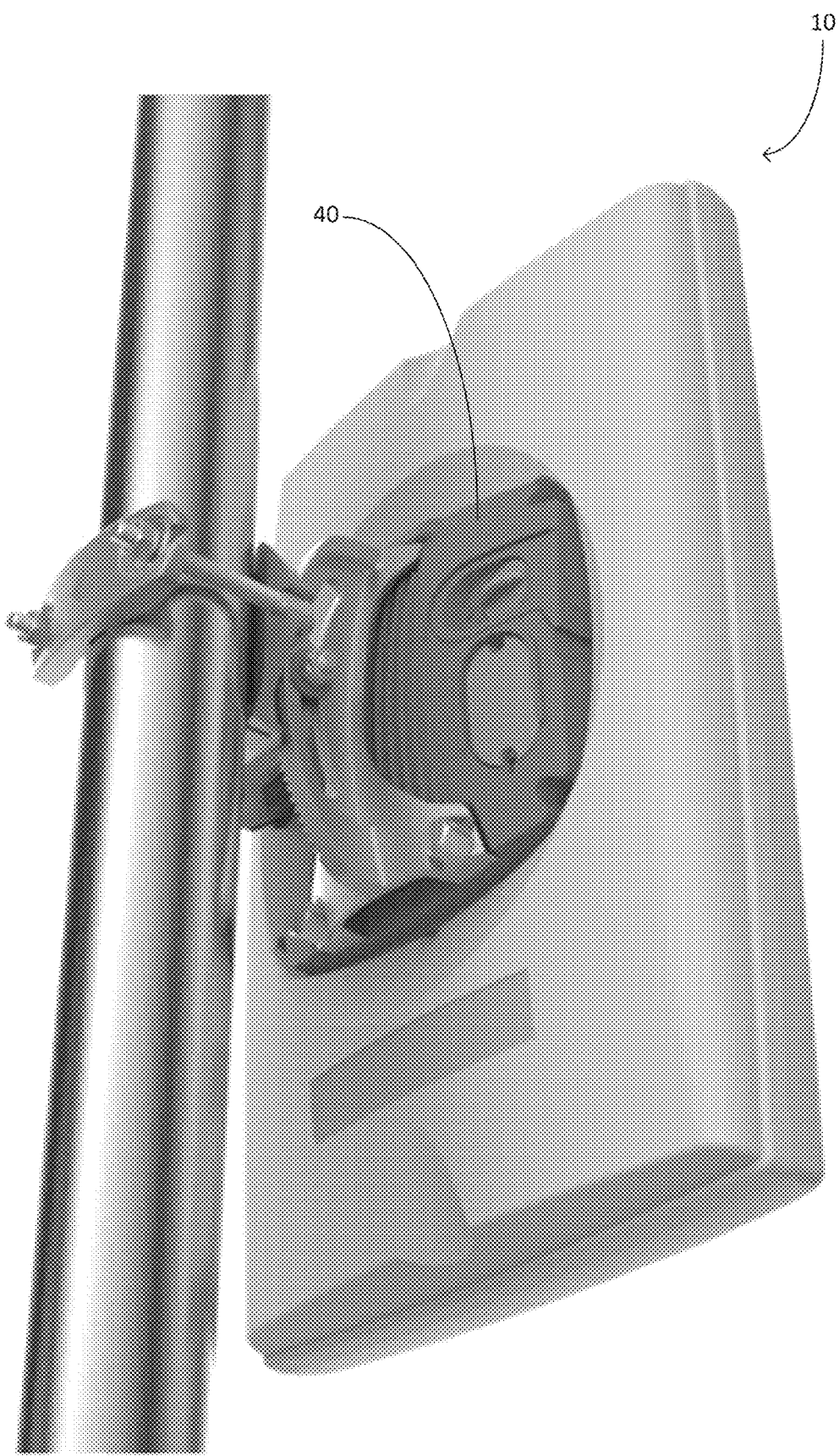
FIG. 9 is a photo of a radome of a first embodiment mounted to a pole.
Figure 10:
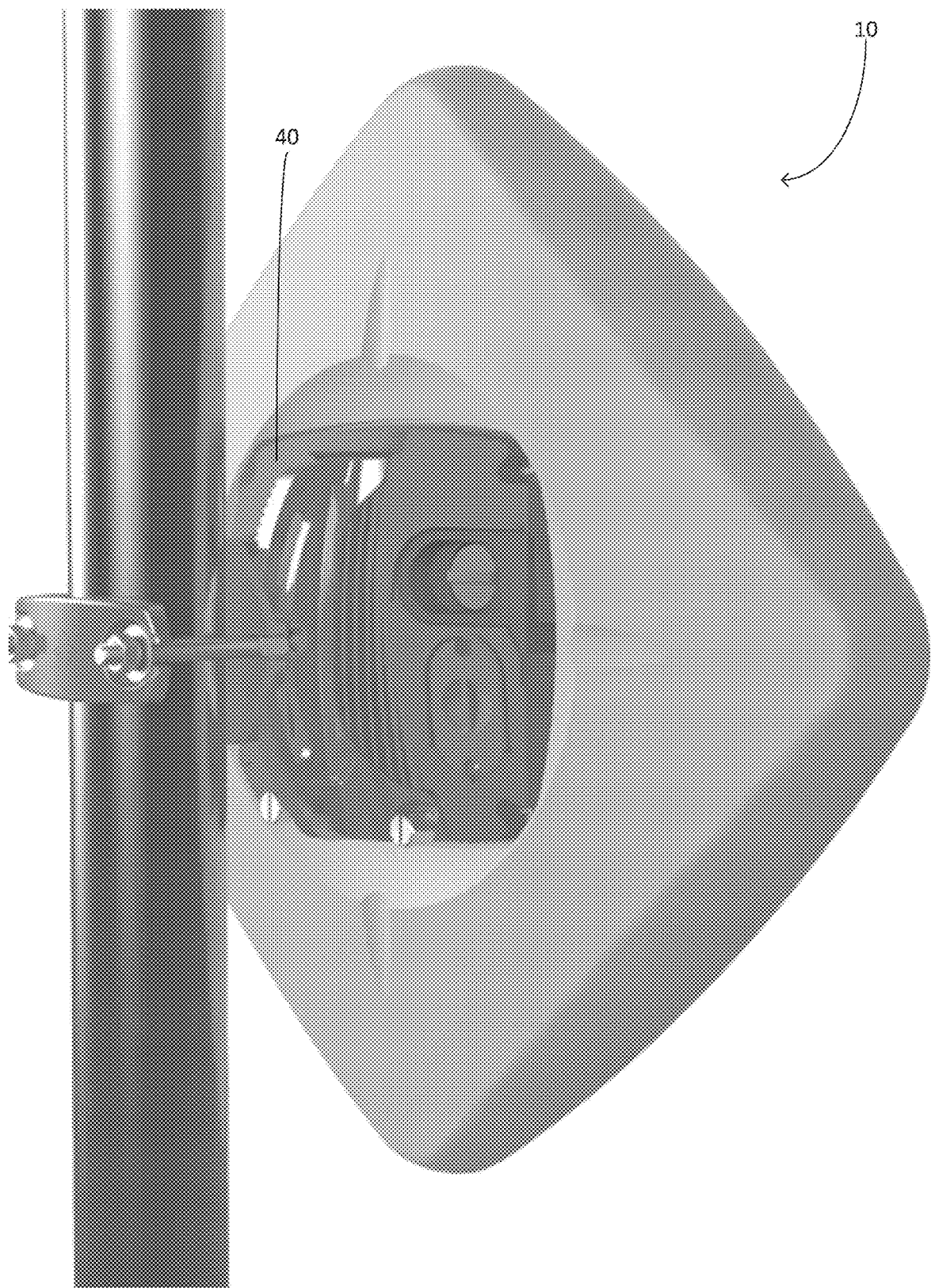
FIG. 10 is a photo of a radome of a second embodiment mounted to a pole.

The radome 10 may have different shapes depending on the specific application and antenna panel 50 required to be housed. Referring to FIG. 9, the radome 10 has a rectangular shape. Referring to FIG. 10, the radome 10 has a diamond shape.

Referring to FIGS. 1 and 3, the rear casting 40 has a shape that fits into the receptacle region 27 provided on the outer surface of the rear portion 20. The outer surface of the rear portion 20 is structured to connect with a height adjustable mounting bracket that may be affixed to a pole (see FIGS. 9 and 10). A compressible/deformable seal 41 is positioned between the lower surface of the peripheral edge of the rear casting 40 and the receptacle region 27 of the rear portion 20 to provide a waterproof seal between the lower surface of the rear casting 40 and the upper surface of the rear portion 20. The deformable seal 41 has a shape corresponding the cross-sectional outline of the rear casting 40. Four screws 42 are used to mechanically fasten the rear casting 40 to the rear portion 20 and a certain level of tightening causes the deformable seal 41 to slightly deform or compress and form the waterproof seal.

Referring to FIGS. 4 and 5, reinforcement ribs 25, 35 are provided along the inner surface of the rear portion 20 and front portion 30, respectively. The size and position of the reinforcement ribs 25, 35 are selected based on radio frequency performance required of the antenna panel 50. The use of reinforcement ribs 25, 35 enables the wall thickness of the front and rear portions 20, 30 to be reduced leading to a reduction in overall weight.

Advantageously, the radome 10 does not require two radome rubber seals between the two halves that exists in prior radomes. Another advantage is that multiple screw fasteners to fasten the two halves are not required in the radome 10 of the present invention. Both these advantages save time for factory assembly and provide convenience.

Another advantage provided by the radome 10 of the present invention is that there is a reduction in the material required for the two halves 20, 30 using the monocoque construction, leading to less weight and lower manufacturing cost and also an increase in strength. Another reason weight is further reduced is because the groundplane for the antenna panel 50 can be made 0.8 mm thinner (44%) as there is no risk for the groundplane to be damaged by warping, bending or distorted during transit from the manufacturing site to the installation site because the antenna panel 50 is assembled within the radome 10 at the manufacturing site. The elimination of screws and radome seals and assembly labour reduces costs and decreases the overall weight of the radome 10 making it easier and safer for installers to install the radome 10 at installation sites where they may be in an elevated position and subject to windy conditions. The weight reduction of the two halves 20, 30 may be 10% compared to prior radomes, which excludes the weight reduction from removal of traditional radome seals, additional screws and additional thickness required for groundplanes with prior radomes.

Unless specified to the contrary, any and all components herein described are understood to be capable of being manufactured and, as such, may be manufactured together or separately.

Moreover, in interpreting the disclosure, all terms should be interpreted in the broadest reasonable manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

The subject headings used in the detailed description are included only for the ease of reference of the reader and should not be used to limit the subject matter found throughout the disclosure or the claims. The subject headings should not be used in construing the scope of the claims or the claim limitations.

Although the technology herein has been described with reference to particular examples, it is to be understood that these examples are merely illustrative of the principles and applications of the technology. In some instances, the terminology and symbols may imply specific details that are not required to practice the technology. For example, although the terms "first" and "second" may be used, unless otherwise specified, they are not intended to indicate any order but may be utilised to distinguish between distinct elements.

It is therefore to be understood that numerous modifications may be made to the illustrative examples and that other arrangements may be devised without departing from the spirit and scope of the technology.

What is claimed is:

1. A radome housing for an antenna, the radome housing comprising:
    a monocoque front housing half having a peripheral lower edge; and
    a monocoque rear housing half having a peripheral upper edge and configured to mate with the monocoque front housing half in defining a hollow interior in which an antenna arrangement may be received;
    wherein the front housing half peripheral edge is shaped to define a peripheral channel region configured to receive the rear housing half peripheral edge and contains an adhesive sealant in which the rear housing half peripheral edge is partially submerged in the adhesive sealant before it cures;
    wherein the monocoque front housing half includes a plurality of alignment pins configured to align the monocoque front housing half to the monocoque rear housing half and prevent accidental contact of the rear housing half peripheral edge with the adhesive sealant unless there is said alignment in the process of mating the housing halves; and
    wherein the monocoque front housing half includes at least one first clip engagement member and the monocoque rear housing half includes at least one corresponding second clip engagement member configured to mechanically engage with the at least one first clip engagement member and mechanically secure the housing halves to each other in addition to bonding and sealing provided by the adhesive sealant.

2. The radome housing according to claim 1, wherein the peripheral upper edge of the monocoque rear housing half is castellated or scalloped to increase a bonding surface area of the peripheral upper edge.

3. The radome housing according to claim 1, wherein the first clip engagement member has a lower height than the alignment pins such that alignment of the monocoque front housing half to the monocoque rear housing half occurs before mechanical engagement of the first and second clip engagement members.

4. The radome housing according to claim 1, wherein the peripheral channel region is substantially U-shaped.

5. The radome housing according to claim 1, wherein the peripheral channel region has a blind end comprising a stepped portion.

6. The radome housing according to claim 5, wherein the rear housing half peripheral edge extends from an inner surface of the monocoque rear housing half and is set back from an outer surface of the monocoque rear housing half.

7. The radome housing according to claim 6, wherein a base of the rear housing half peripheral edge is configured to abut against the stepped portion causing excess adhesive sealant to be displaced towards an inner wall surface of the peripheral channel region.

8. The radome housing according to claim 1, further comprising a rear casting fitted and secured into a receptacle region provided on an outer surface of the rear housing half, the casting structured to connect with a height adjustable mounting bracket that is affixable to a pole for installation of the radome.

9. The radome housing according to claim 8, wherein a compressible/deformable seal is positioned between a lower surface of a peripheral edge of the rear casting and the receptacle region of the rear housing half to provide a waterproof seal between the lower surface of the rear casting and the outer surface of the rear housing half.

\* \* \* \* \*